US008378734B2

(12) United States Patent
Ha et al.

(10) Patent No.: US 8,378,734 B2
(45) Date of Patent: Feb. 19, 2013

(54) METHOD AND SYSTEM FOR REDUCTION OF OFF-CURRENT IN FIELD EFFECT TRANSISTORS

(75) Inventors: Yong-Min Ha, Gyeongsangbuk-do (KR); Kee-Jong Kim, Gyeongsangbuk-do (KR); Byeoung-Koo Kim, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 1577 days.

(21) Appl. No.: 10/396,312

(22) Filed: Mar. 26, 2003

(65) Prior Publication Data

US 2004/0041618 A1 Mar. 4, 2004

(30) Foreign Application Priority Data

Aug. 29, 2002 (KR) ........................ 10-2002-0051513

(51) Int. Cl.
*H03K 17/687* (2006.01)

(52) U.S. Cl. ........... 327/434; 327/313; 327/581; 349/43

(58) Field of Classification Search .................. 327/313, 327/419, 427, 430, 431, 434, 436, 437, 447, 327/451, 465, 567, 574, 581; 345/92–98, 345/147, 148, 205, 206; 349/43, 44
See application file for complete search history.

(56) References Cited

U.S. PATENT DOCUMENTS

| | | | | |
|---|---|---|---|---|
| 3,551,698 | A * | 12/1970 | Smith | 327/96 |
| 3,646,364 | A * | 2/1972 | Kaminski | 327/389 |
| 4,316,101 | A * | 2/1982 | Minner | 327/434 |
| 4,500,802 | A * | 2/1985 | Janutka | 327/432 |
| 4,647,848 | A * | 3/1987 | Barrett | 324/95 |
| 5,526,012 | A * | 6/1996 | Shibahara | 345/92 |
| 5,798,744 | A * | 8/1998 | Tanaka et al. | 345/92 |
| 5,945,866 | A * | 8/1999 | Fonash et al. | 327/427 |
| 5,977,940 | A * | 11/1999 | Akiyama et al. | 345/94 |
| 6,008,687 | A * | 12/1999 | Orita et al. | 327/515 |
| 6,066,973 | A * | 5/2000 | Sekino et al. | 327/313 |
| 6,504,523 | B1 * | 1/2003 | Sugawara et al. | 345/98 |
| 6,894,312 | B2 * | 5/2005 | Yamazaki et al. | 257/72 |

FOREIGN PATENT DOCUMENTS

| | | | |
|---|---|---|---|
| JP | 55093322 | A * | 7/1980 |
| KR | 1998-13720 | | 5/1998 |
| KR | 10-0305414 | | 7/2001 |

OTHER PUBLICATIONS

Uraoka, Yukiharu, et al., "Hot Carrier Effect in Low-Temperature poly-Si p-cho Thin-Film Transistors under Dynamic Stress", Japanese Journal of Applied Physics, Part. 2, No. 1A/B, Jan. 15, 2002.

* cited by examiner

*Primary Examiner* — Lincoln Donovan
*Assistant Examiner* — William Hernandez
(74) *Attorney, Agent, or Firm* — McKenna Long & Aldridge, LLP

(57) ABSTRACT

A method for reducing an off-current of a field effect transistor in which two electrodes of the field effect transistor have fixed voltage values and the rest electrode has an alternating voltage value by an AC voltage pulse generator to form an off-stress near source and drain junctions in turn.

37 Claims, 13 Drawing Sheets

METHOD AND SYSTEM FOR REDUCTION OF OFF-CURRENT IN FIELD EFFECT TRANSISTORS

The present invention claims the benefit of Korean Patent Application No. 2002-51513, filed on Aug. 29, 2002 in Korea, which is hereby incorporated by reference.

BACKGROUND OF THE INVENTION

1. Field of the Invention

The present invention relates to field effect transistors and more particularly, to a method and system for reduction of OFF-current in field effect transistors.

2. Discussion of the Related Art

In general, field effect transistors are known to function where one of an electron or a hole plays a role of a carrier that contributes to electrical conduction. In addition, an oxide film is formed on a semiconductor layer and a metal layer is formed on the oxide film. Moreover, thin film transistors have been commonly used as switching elements in liquid crystal display (LCD) devices.

FIG. 1 is cross-sectional view of a field effect transistor according to the related art. In FIG. 1, the field effect transistor includes an active layer 2, an insulating layer 4, a gate electrode 8, a passivation layer 10, and source and drain electrodes 12 and 14. The active layer 2 is formed on a substrate 1, such as a glass or a wafer, and the insulating layer 4 is formed on the active layer 2. The gate electrode 8 is formed on the insulating layer 4, and the passivation layer 10 covers the gate electrode 8 and the insulating layer 4. The source and drain electrodes 12 and 14 contact the active layer 2 through the passivation layer 10 and the insulating layer 4. A source region "s" and a drain region "d" include impurity ions and are spaced apart from each other in the active layer 2. The impurity ions are not present within a channel region 3 located between the source region "s" and the drain region "d." The source electrode 12 is connected to the source region "s" and the drain electrode 14 is connected to the drain region "d." If a voltage is applied to the gate electrode 8 of the field effect transistor, carriers are driven into the channel region 3 and the source and drain electrodes 12 and 14 are in electrical communication with each other. A boundary between the source region "s" and the channel region 3 is commonly referred to as a source junction 2*b*, and a boundary between the drain region "d" and the channel region 3 is commonly referred to as a drain junction 2*a*.

Amorphous silicon or polycrystalline silicon may be used for the active layer 2. Amorphous silicon has been commonly used for flat panel display devices, such as liquid crystal display (LCD) devices, since it can be easily deposited over large areas under low temperatures of about 350° C. However, many localized defects occur since amorphous silicon has disordered atomic arrangement and weak Si—Si bonding. Alternatively, polycrystalline silicon has ordered atomic arrangement and electric mobility 100 times as fast as amorphous silicon. However, polycrystalline silicon demonstrates large amounts of leakage currents due to trap boundaries of crystal grains. Accordingly, the defects of both amorphous and polycrystalline silicon materials eventually increase an OFF-current of the field effect transistor, thereby the source and drain electrode 12 and 14 are frequently in electrical communication even when the field effect transistor is a desired OFF-state. The increase of the OFF-current of the field effect transistor decreases an ON-current of the field effect transistor, thereby deteriorating device reliability. The OFF-current condition is considered more serious in the field effect transistor that uses polycrystalline silicon.

Thus, many structural methods have been suggested to overcome the OFF-current problems. For example, a field effect transistor having a dual gate structure or a multi-gate structure has been suggested. In addition, an off-set region may be fonned within a vicinity of the source and drain junctions, or a lightly-doped drain structure may be applied to the field effect transistor.

Alternatively, a method to reduce the OFF-current without changing the structure of the field effect transistor has been suggested. For example, the OFF-current can be reduced by generating an OFF-stress to each junction region using two AC (alternating current) voltage pulses to overcome the defects of the silicon active layer. The OFF-stress is generated in the junction regions by applying the AC (alternating current) voltage pulses respectively to the gate electrode and the drain electrode, respectively, as disclosed in U.S. Pat. No. 5,945,866, which is hereby incorporated by reference.

FIG. 2 is an equivalent circuit diagram of a pixel of a liquid crystal panel for a liquid crystal display (LCD) device according to the related art. In FIG. 2, the liquid crystal panel has a gate line 32 disposed along a first direction and a data line 34 disposed along a second direction. The gate line 32 transmits a scan signal voltage and the data line 34 transmits an image signal voltage. Crossings of the gate and data lines 32 and 34 define pixel regions, and the field effect transistor and the liquid crystal capacitor $C_{LC}$ are formed at each of the pixel regions. A thin film transistor is commonly used for the field effect transistor because of its light weight and small dimensions. A gate electrode G of the field effect transistor is connected to the gate line 32, and a drain electrode D is connected to the data line 34. A source electrode S is electrically connected to a pixel electrode (not shown), which is commonly used as one of electrodes for applying a voltage to liquid crystal material (not shown).

Although not shown, the liquid crystal capacitor $C_{LC}$ comprises the pixel electrode, a common electrode, and the liquid crystal material that is disposed between the pixel electrode and the common electrode, wherein a common line 37 is connected to the common electrode. Since the liquid crystal display device usually displays images on a frame-by-frame basis, a voltage that is applied to the liquid crystal capacitor $C_{LC}$ must be maintained until a voltage for a next frame is applied to the liquid crystal capacitor $C_{LC}$. Accordingly, a storage capacitor $C_{St}$ is provided to preserve the voltage until the next voltage for the next frame is applied. The storage capacitor $C_{St}$ is electrically connected in parallel to the liquid crystal capacitor $C_{LC}$, and may be a storage-on-common type (SOC) storage capacitor $C_{St}$ that has an additional storage line 36. The storage capacitor $C_{St}$ serves to stabilize gray level, reduce flicker and residual image, as well as to preserve the signal. Accordingly, the two different AC voltage pulses are applied to the gate electrode G and the drain electrode D of the field effect transistor to reduce the OFF-current.

FIG. 3A is a graph of voltages applied to each electrode of a field effect transistor for reducing an OFF-current in the field effect transistor according to the related art, and FIGS. 3B and 3C are schematic diagrams illustrating voltage values of each electrode of the field effect transistor when the voltages of FIG. 3A are applied according to the related art. In FIGS. 3A to 3C, if a negative voltage of −10V (volt) is applied to the gate electrode G to turn the field effect transistor ON, an electric current flows from the drain electrode D to the source electrode S. Accordingly, a negative voltage of −10V (volt) is subsequently applied to the drain electrode D and is conducted to the source electrode S. Then, the field effect transistor is turned OFF by application of a positive voltage of +30V (volt) to the gate electrode, and a voltage of 0V (volts) is applied to the drain electrode D. Accordingly, the gate electrode G has a voltage value of +30V, the drain electrode D has a voltage value of 0V, and the source electrode S has a voltage value of −10 V, as shown in FIG. 3B. Thus, a significant potential difference exists between the gate electrode G and the drain electrode D, and a significant potential difference exists between the gate electrode G and the source electrode S. Accordingly, an OFF-stress phenomenon occurs at regions near to the drain and source junction 2*a* and 2*b* (in FIG. 1). A greater OFF-stress effect is expected to occur at the source junction 2*b* (in FIG. 1), which is shown in FIG. 3B as an arrow, since the potential difference between the gate electrode G and the source electrode S is larger than the potential difference between the gate electrode G and the drain electrode D. If a negative voltage of −10 V is applied to the gate electrode G again to turn the field effect transistor ON, then the source electrode S is discharged to have a voltage of 0V. Subsequently, a positive voltage of +30 V is applied to the gate electrode G to turn the field effect transistor OFF and a negative voltage of −10 V is simultaneously applied to the drain electrode D. As a result, there are potential differences between the gate electrode G and the drain electrode D, and between the gate electrode G and the source electrode S, as shown in FIG. 3C. Since the potential difference between the gate electrode G and the drain electrode D is larger than the potential difference between the gate electrode G and the source electrode S, a greater OFF-stress effect occurs at the drain junction 2*a* (in FIG. 1) than the source junction 2*b* (in FIG. 1). Accordingly, the process reduces the defect of the silicon active layer by generating the OFF-stress at the drain and source junctions 2*a* and 2*b* (in FIG. 1). The process uses two AC voltage pulses for the gate electrode G and for one AC voltage pulse for the drain and source electrodes D and S. However, it is not easy to control the period of the AC voltage pulses accurately with proper timing.

SUMMARY OF THE INVENTION

Accordingly, the present invention is directed to a system and a method for reducing an OFF-current of field effect transistors that substantially obviates one or more of problems due to limitations and disadvantages of the related art.

An object of the present invention is to provide a method for reducing an OFF-current of a field effect transistor to form an OFF-stress near source and drain junctions.

Another object of the present invention is to provide a system for reducing an OFF-current of a field effect transistor to form an OFF-stress near source and drain junctions.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to the illustrated embodiment of the present invention, which is illustrated in the accompanying drawings.

Figure 1:
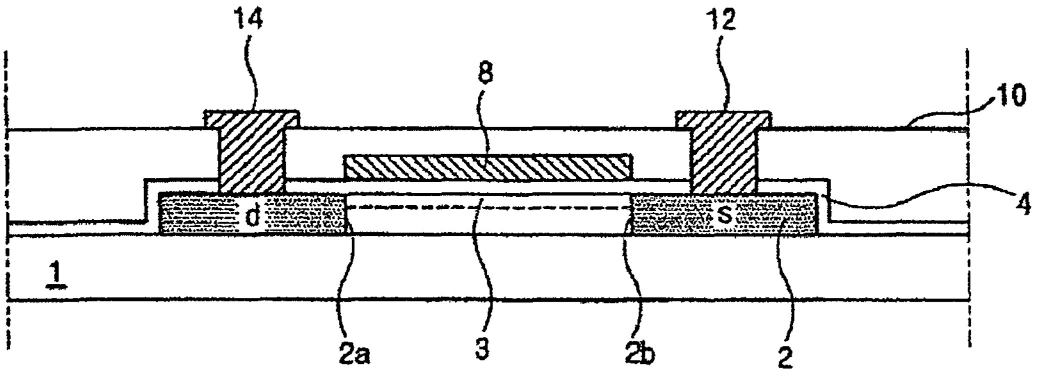
FIG. 1 RELATED ART
FIG. 1 is cross-sectional view of a field effect transistor according to the related art.
Figure 2:
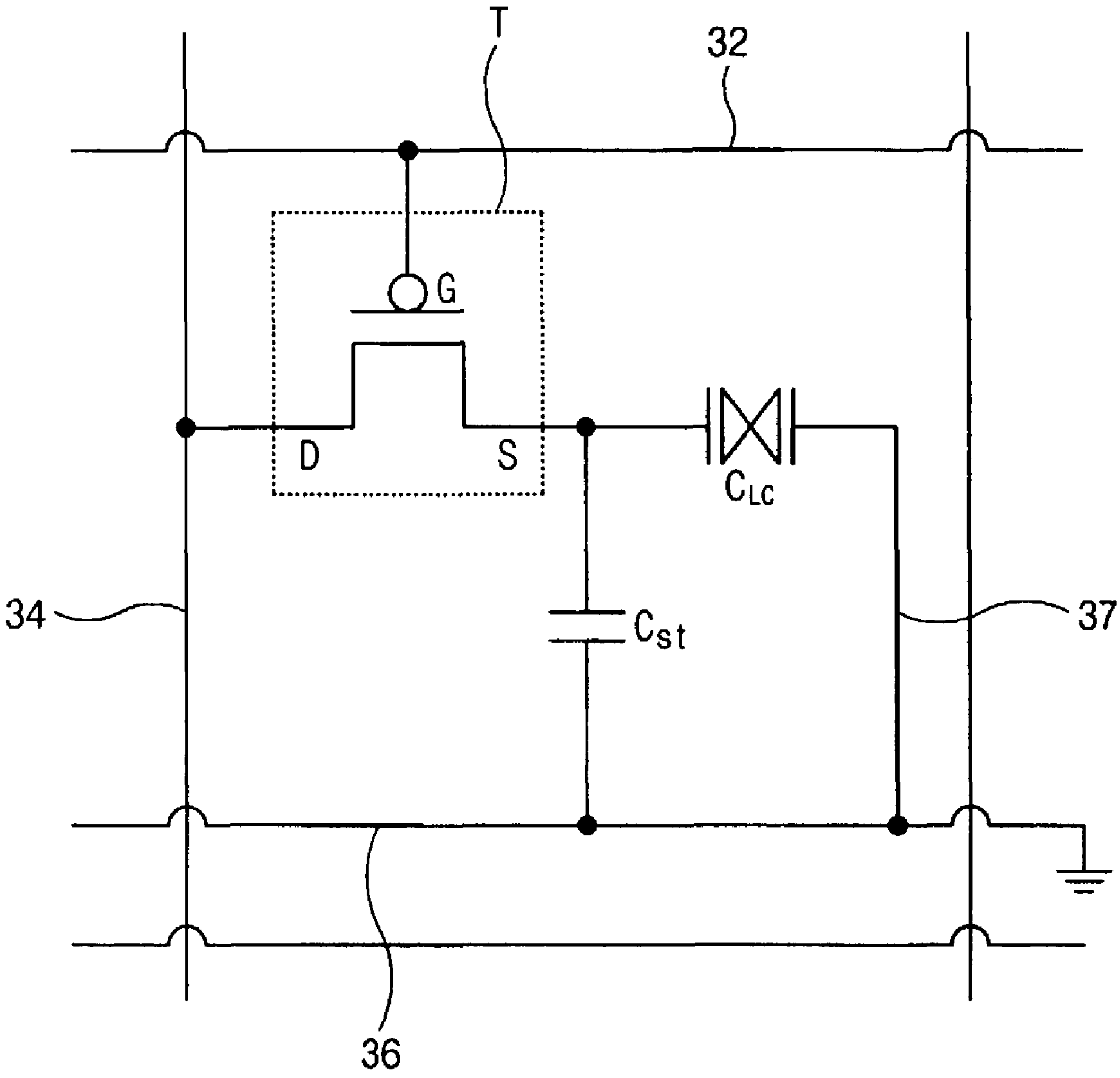
FIG. 2 RELATED ART
FIG. 2 is an equivalent circuit diagram of a pixel of a liquid crystal panel for a liquid crystal display (LCD) device according to the related art.
Figure 3A:
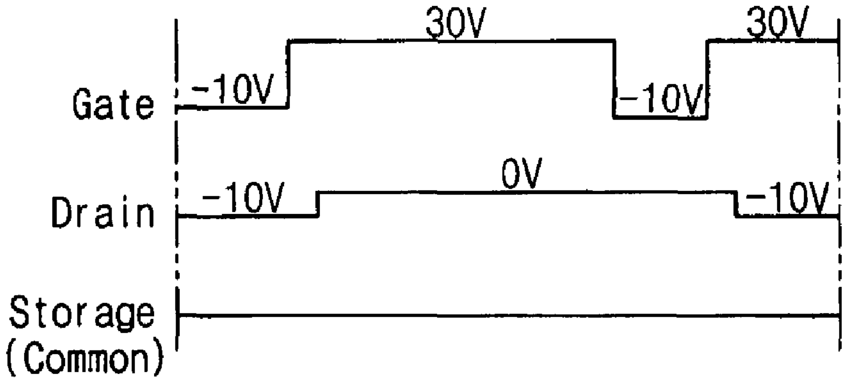
FIG. 3A RELATED ART
FIG. 3A is a graph of voltages applied to each electrode of a field effect transistor for reducing an OFF-current in the field effect transistor according to the related art.
Figure 3B:
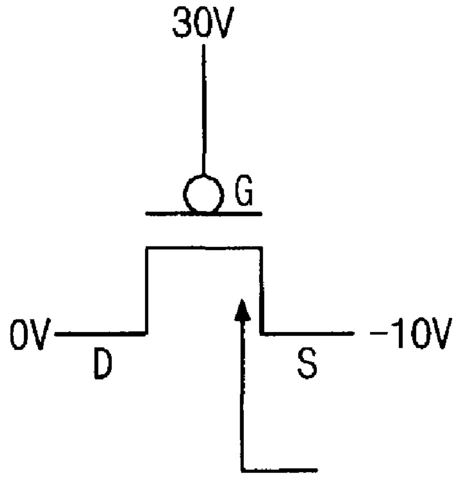
FIG. 3B RELATED ART
FIGS. 3B and 3C are schematic diagrams illustrating voltage values of each electrode of the field effect transistor when the voltages of FIG. 3A are applied according to the related art.
Figure 3C:
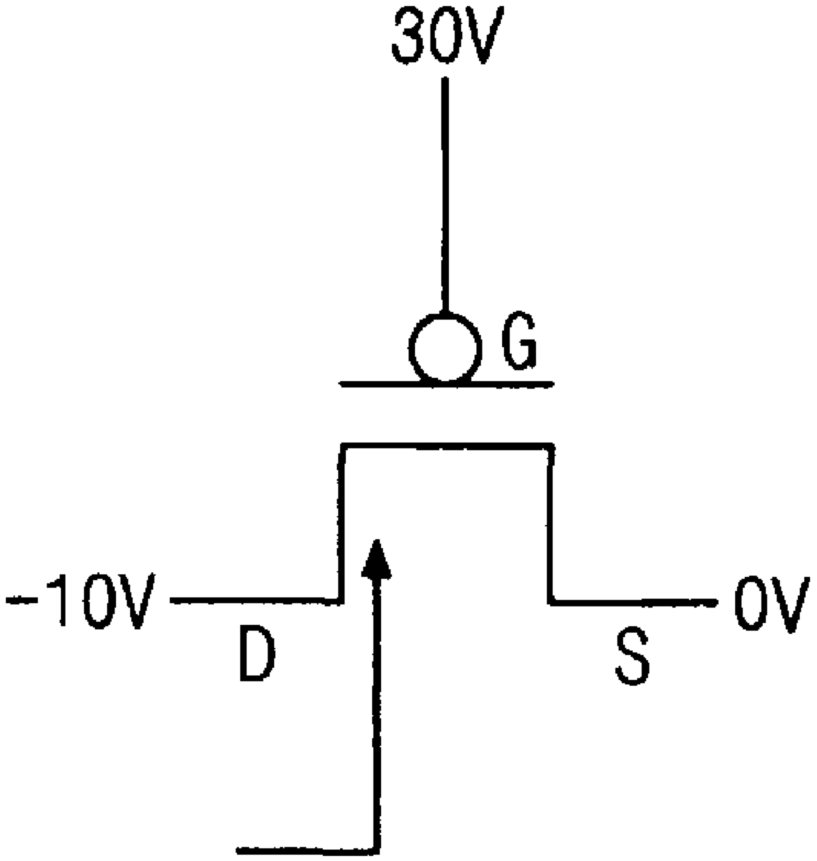
FIG. 3C RELATED ART
Figure 4A:
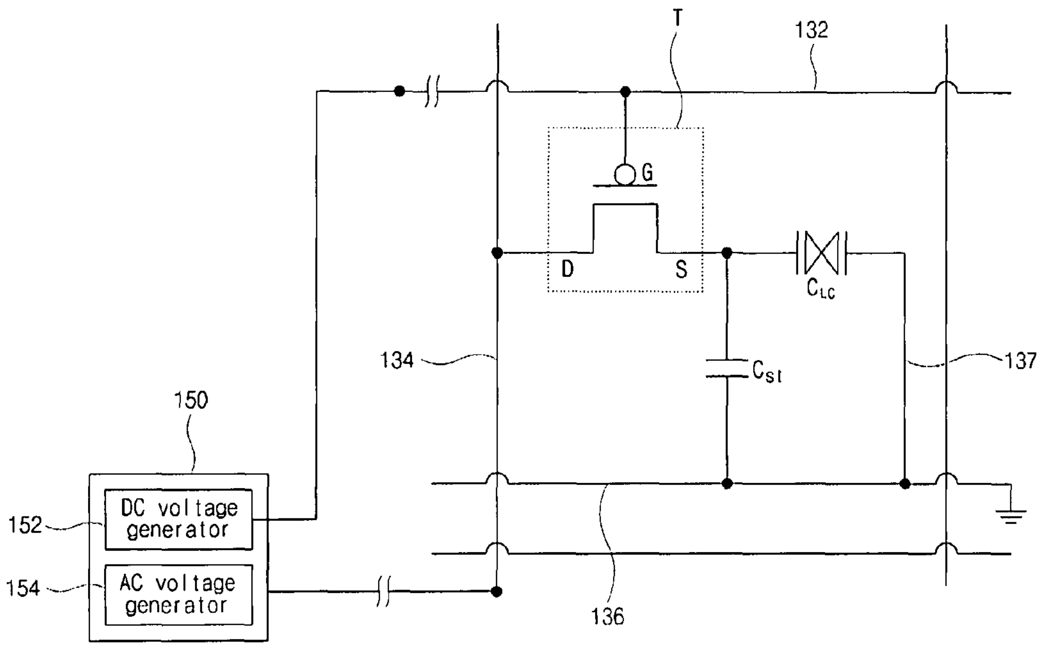
FIG. 4A is an exemplary equivalent circuit diagram of a pixel of a liquid crystal panel for a liquid crystal display (LCD) device having a system for reducing OFF-current in a field effect transistor according to the present invention.

FIG. 4A is an exemplary equivalent circuit diagram of a pixel of a liquid crystal panel for a liquid crystal display (LCD) device having a system for reducing OFF-current in a field effect transistor according to the present invention. In FIG. 4A, a gate line 132 may be formed along a first direction and a data line 134 may be formed along a second direction perpendicular to the first direction. The gate line 132 may transmit a scan signal voltage and the data line 134 may transmit an image signal voltage. A crossing of the gate line 132 and the data line 134 may define a pixel region, wherein a field effect transistor T and a liquid crystal capacitor $C_{LC}$ may formed at the pixel region. The field effect transistor may include a gate electrode G, a drain electrode D, and a source electrode S. The gate electrode G may be electrically connected to the gate line 132 and the drain electrode D may be electrically connected to the data line 134, wherein the source electrode S may be electrically connected to the liquid crystal capacitor $C_{LC}$. The liquid crystal capacitor $C_{LC}$ may include two opposing electrodes with liquid crystal material disposed therebetween, and a common line 137 may be connected to one of the two opposing electrodes.

A storage capacitor $C_{St}$ may be connected in parallel to the liquid crystal capacitor $C_{LC}$ to preserve an applied voltage. For example, in case of a liquid crystal panel in which images are displayed in a frame-by-frame basis, a voltage that is applied to the liquid crystal capacitor $C_{LC}$ in a previous frame must be preserved until the next frame is received. Accordingly, the storage capacitor $C_{St}$ functions to preserve the voltage. A storage-on-common type circuit may be included to have an additional storage line 136. The storage capacitor $C_{St}$ may function to stabilize a gray level and to reduce flicker and residual image effects. An OFF-current reduction system according to the present invention may further include a separate voltage generator 150 that comprises a DC (direct current) voltage generator 152 and an AC (alternating current) voltage generator 154. Each of the electrodes D and S of the field effect transistor T may be selectively connected to one of the DC voltage generator 152 and the AC voltage generator 154. In addition, a first one of the three electrodes G, D, and S may be grounded, and a second one of the electrodes G, D, and S may receive the AC voltage pulse for reducing the OFF-current of the field effect transistor T. A third one of the electrodes G, D, and S may be selectively grounded or may receive the DC voltage. Since the voltage generator 150 reduces the OFF-current of the field effect transistor T, it may be removed during a manufacturing process after a manufacturing process of a liquid crystal panel.

Figure 4B:
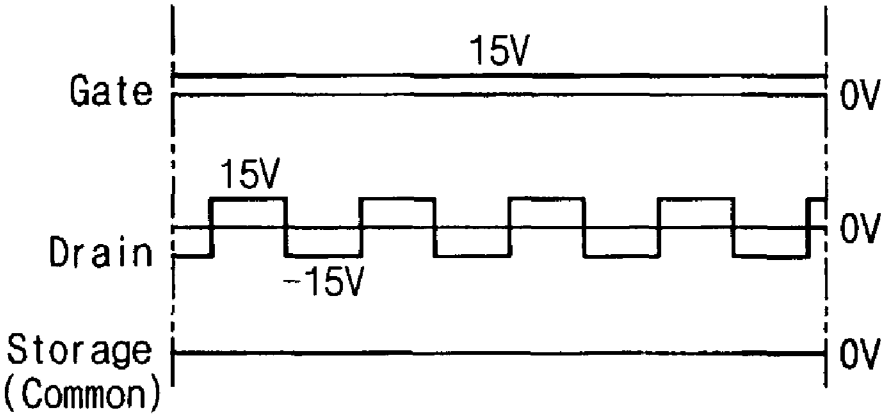
FIG. 4B is an exemplary graph of voltages applied to each electrode of a field effect transistor for reducing an OFF-current in the field effect transistor according to the present invention.
Figure 4C:
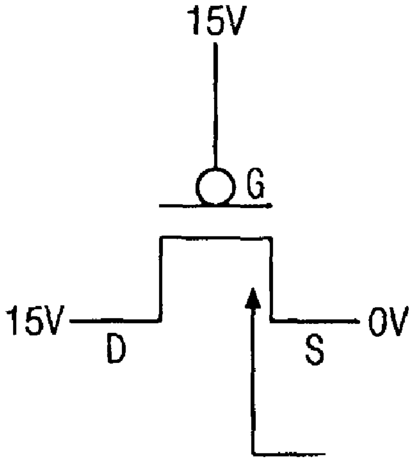
FIGS. 4C and 4D are exemplary schematic diagrams illustrating voltage values of each electrode of the field effect transistor when the voltages of FIG. 4B are applied according to the present invention.
Figure 4D:
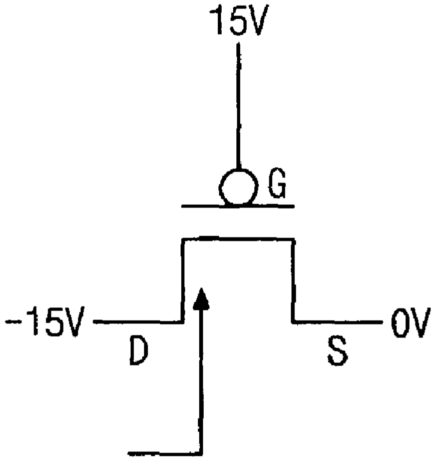

FIG. 4B is an exemplary graph of voltages applied to each electrode of a field effect transistor for reducing an OFF-current in the field effect transistor according to the present invention. Although a PMOS type transistor T is shown, the present invention may be applied to a NMOS type transistor. In FIG. 4B, the DC voltage may be applied to the gate electrode G to turn the transistor T OFF, and the storage line 136 and the common line 137 may be grounded. While a positive DC voltage may be applied to the gate electrode G to turn the PMOS type transistor T OFF, a negative DC voltage may be applied to the gate electrode G to turn the NMOS type transistor (not shown) OFF. It may be desirable to apply the DC voltage above +10V (volt) for the PMOS type transistor and apply the DC voltage below −10V (volt) for the NMOS type transistor. Accordingly, in FIG. 4B, a positive DC voltage of +15V is applied to the gate electrode G. The AC voltage pulse may be applied to the drain electrode D, and may have a rectangular pulse with amplitude of ±15V. It may be desirable that a maximum AC voltage value be above +10V and a minimum voltage value be below −10V, and the AC voltage pulse may have a frequency of about 0~500 KHz. If the maximum voltage value of the AC voltage pulse may be applied to the drain electrode D, then the voltage value of the gate electrode G may be +15V, the source electrode S may be 0V, and the drain electrode D may be +15V, as shown in FIG. 4C. However, although there is no potential difference between the gate electrode G and the drain electrode D, there exists a potential difference between the gate electrode G and the source electrode S. Accordingly, an OFF-stress may occur near a source junction (not shown) of the transistor T (in FIG. 4A). If a minimum voltage value of the AC voltage pulse is applied to the drain electrode D, then a voltage value of the gate electrode G may be +15V, the voltage value of the source electrode S may be 0V, and the voltage value of the drain electrode D may be −15V, as shown in FIG. 4D. Since a potential difference between the gate electrode G and the drain electrode D is greater than a potential difference between the gate electrode G and the source electrode S, the OFF-stress occurs near the drain junction (not shown) of the transistor 7 (in FIG. 4A). The OFF-stress phenomenon near the drain and source junctions (not shown) repeatedly occurs by the AC voltage pulses to cure a defect of silicon active layer. The above-mentioned process may be performed repeatedly and a desirable duration time of each AC voltage pulse may be above 10 seconds.

Figure 5A:
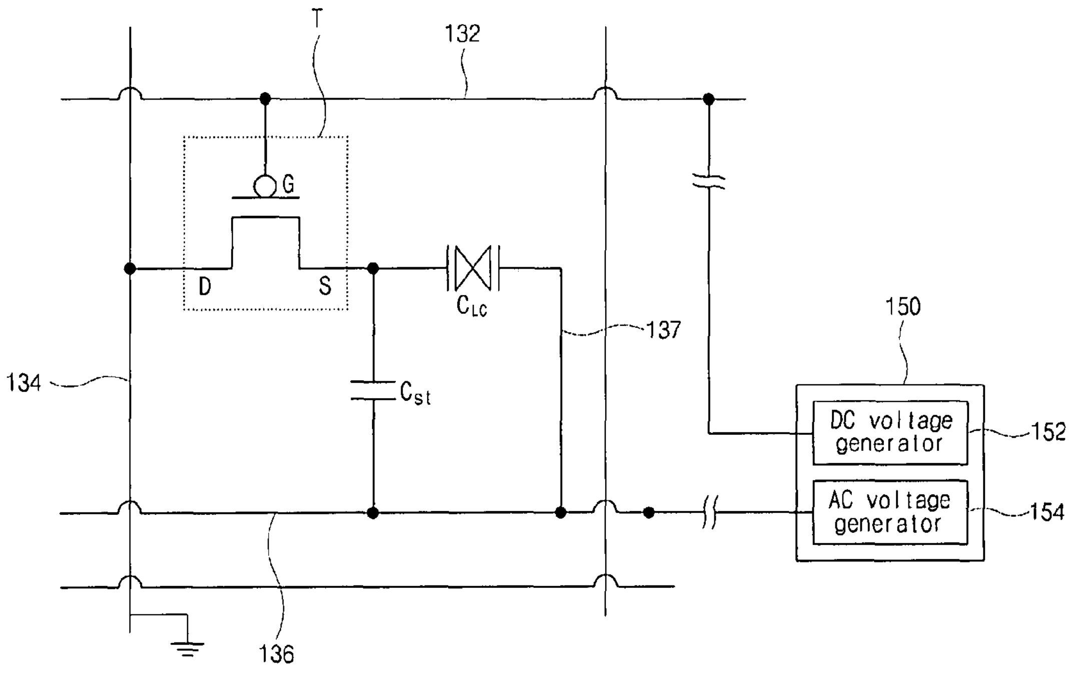
FIG. 5A is another exemplary equivalent circuit diagram of a pixel of a liquid crystal panel for a liquid crystal display (LCD) device having a system for reducing OFF-current in a field effect transistor according to the present invention.

FIG. 5A is another exemplary equivalent circuit diagram of a pixel of a liquid crystal panel for a liquid crystal display (LCD) device having a system for reducing OFF-current in a field effect transistor according to the present invention. In FIG. 5A, a gate electrode G may be electrically connected to a DC voltage generator 152 to turn the field effect transistor T OFF, a storage line 136 (or a common line 137) may be electrically connected to a AC voltage generator 154, and a drain electrode D may be grounded.

Figure 5B:
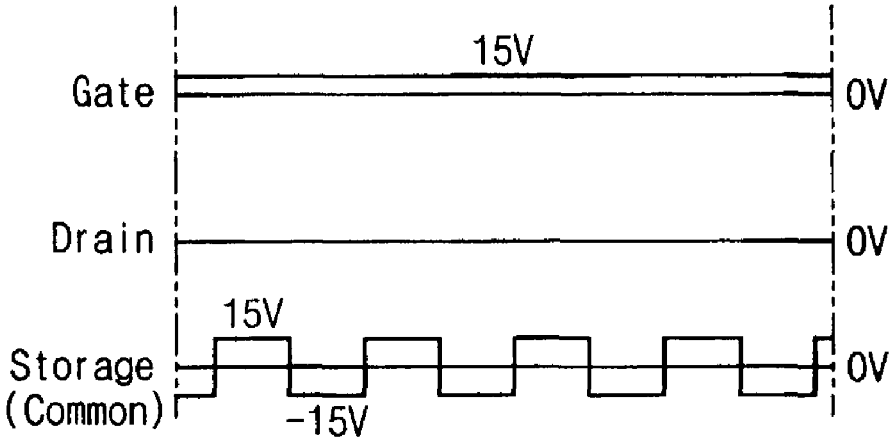
FIG. 5B is an exemplary graph of voltages applied to each electrode of a field effect transistor for reducing an OFF-current in the field effect transistor according to the present invention.

FIG. 5B is an exemplary graph of voltages applied to each electrode of a field effect transistor for reducing an OFF-current in the field effect transistor according to the present invention. In FIGS. 5A and 5B, a positive DC voltage of +15V may be applied to the gate electrode G to turn the transistor T OFF, wherein the drain electrode D may be grounded. If an NMOS type transistor is used instead of the PMOS type transistor shown in FIG. 5A, then a negative DC voltage may be applied to the gate electrode G to turn the transistor T OFF. It may be desirable that the DC voltage amplitude for the PMOS type transistor be above +10V and the DC voltage amplitude for the NMOS type transistor be below −10V. In FIGS. 5A and 5B, the AC voltage pulse with amplitude of ±15 V may be applied to the storage line 136 from the AC voltage generator 154. However, it may be desirable that a maximum value of the AC voltage pulse be above +10V and a minimum value of the AC voltage pulse may be below −10V. In addition, the AC voltage pulse may have a frequency of about 0-500 KHz.

Figure 5C:
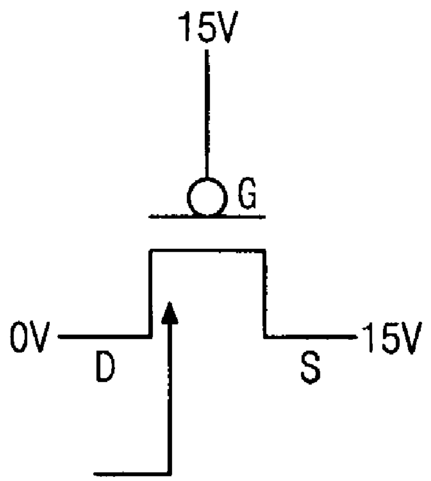
FIGS. 5C and 5D are exemplary schematic diagrams illustrating voltage values of each electrode of the field effect transistor when the voltages of FIG. 5B are applied according to the present invention.
Figure 5D:
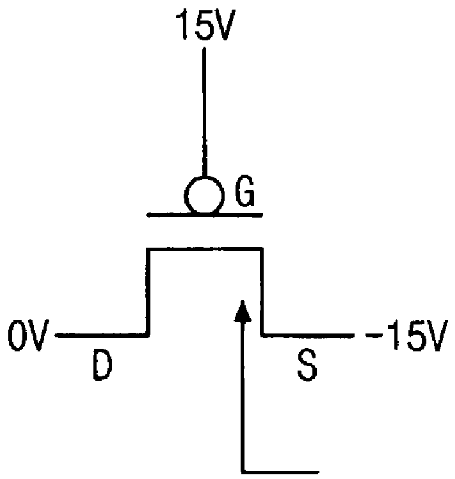

If the maximum voltage of the AC voltage pulse is applied to the storage line 136, then a voltage value of the gate electrode G may be +15V, the voltage value of the drain electrode D may be 0V, and the voltage value of the source electrode S may be +15V, as shown in FIG. 5C. Since there is a potential difference between the gate electrode G and the drain electrode D, the OFF-stress occurs near the drain junction. Subsequently, if the minimum voltage of the AC voltage pulse is applied to the storage line 136, a voltage value of the gate electrode G may be +15V, the voltage value of the drain electrode D may be 0V, and the voltage value of the source electrode S may be −15V, as shown in FIG. 5D. Since there is a potential difference between the gate electrode G and the source electrode S that is greater than a potential difference between the gate electrode G and the drain electrode D, the OFF-stress occurs near the source junction. Accordingly, a repeated OFF-stress phenomenon that occurs alternately near the source and drain junction by the AC voltage pulse improves defects of the silicon active layer. The above process may be performed several times and the AC voltage pulse may be applied for more than 10 seconds.

Figure 6A:
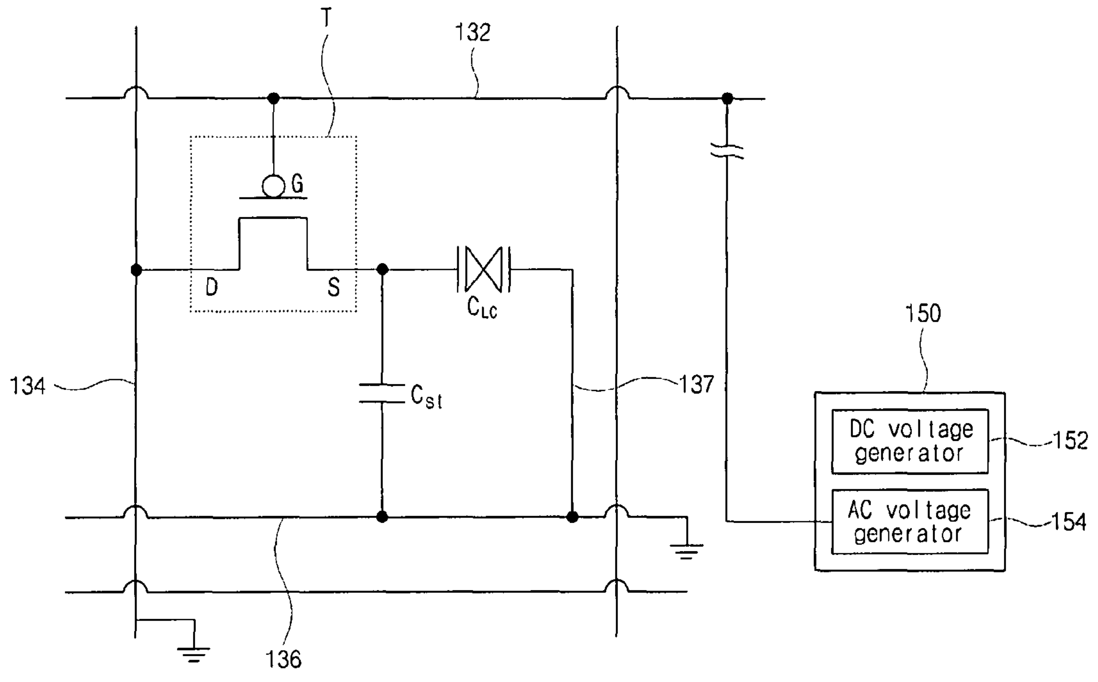
FIG. 6A is another exemplary equivalent circuit diagram of a pixel of a liquid crystal panel for a liquid crystal display (LCD) device having a system for reducing OFF-current in a field effect transistor according to the present invention.

FIG. 6A is another exemplary equivalent circuit diagram of a pixel of a liquid crystal panel for a liquid crystal display (LCD) device having a system for reducing OFF-current in a field effect transistor according to the present invention. In FIG. 6A, a gate electrode G may be electrically connected to a AC voltage generator 154, and a drain electrode D and a storage line 136 may be grounded.

Figure 6B:
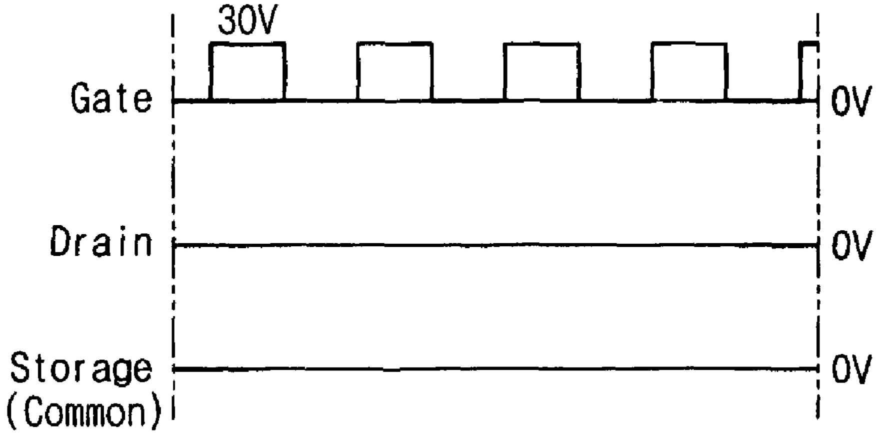
FIG. 6B is an exemplary graph of voltages applied to each electrode of a field effect transistor for reducing an OFF-current in the field effect transistor according to the present invention.

FIG. 6B is an exemplary graph of voltages applied to each electrode of a field effect transistor for reducing an OFF-current in the field effect transistor according to the present invention. In FIGS. 6A and 6B, 0V may be applied to the drain electrode D and the storage line 136 (or common line). Then, an AC voltage pulse may be applied to the gate electrode G. It may be desirable that a positive value of the AC voltage pulse for PMOS type transistors be above +10V, and a negative value of the AC voltage pulse for NMOS type transistors be below −10V. In addition, it may be desirable to use the AC voltage pulse having a frequency of about 0-500 KHz, wherein a minimum voltage value and a maximum voltage value of the AC voltage pulse may be 0V and 30V, respectively. If the maximum voltage is applied to the gate electrode G, then the voltage value of the gate electrode G may be +30V, the voltage value of the drain electrode D may be 0V, and the voltage value of the source electrode S may be 0V.

Figure 6C:
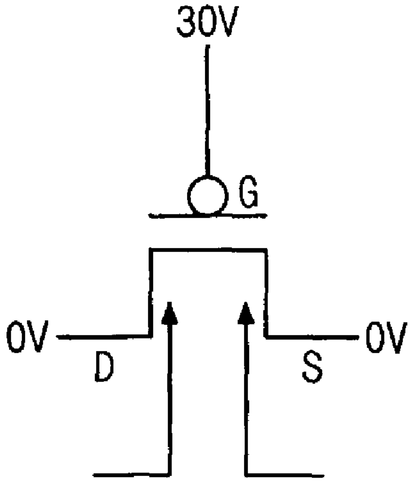
FIGS. 6C and 6D are schematic diagrams illustrating voltage values of each electrode of the field effect transistor when the voltages of FIG. 6B are applied according to the present invention.
Figure 6D:
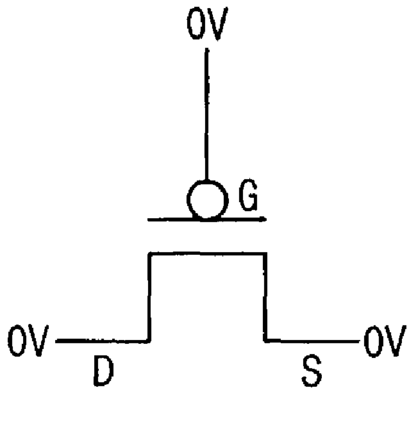

Since the potential differences between the gate electrode G and the drain electrode D and between the gate electrode G and the source electrode S are the same, as shown in FIG. 6C, the OFF-stresses occur near both of the drain and source junctions. If the minimum voltage is applied to the gate electrode G, then all electrodes of the field effect transistor have a voltage value of 0V and no potential differences exist among the gate, source, and drain G, S, and D electrodes, as shown in FIG. 6D. A repeated OFF-stress phenomenon that occurs simultaneously near the source and drain junctions by the AC voltage pulse improves defects of the silicon active layer. The above process may be performed several times and the AC voltage pulse may be applied for more than 10 seconds.

As described above, two selected electrodes among three electrodes of a field effect transistor may have a fixed voltage value, and the remaining electrode may have maximum and minimum values to reduce OFF-current of the field effect transistor. Since only one AC voltage pulse may be used for the present invention, it may be simpler to reduce the OFF-current in which two different AC voltage pulses must be used. In addition, the present invention may be applied to a thin film transistor for a liquid crystal display devices.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A method for reducing an OFF-current of a field effect transistor having a gate electrode, a silicon layer, a source electrode, and a drain electrode, comprising:

applying a DC voltage to the gate electrode to turn the field effect transistor OFF;

grounding the source electrode; and applying an AC voltage pulse to the drain electrode at least once, wherein a voltage difference between the DC voltage and a minimum voltage of the AC voltage pulse is greater than a voltage difference between the DC voltage and a grounding voltage.

2. The method according to claim 1, wherein the field effect transistor is a thin film transistor of a liquid crystal panel for an active matrix liquid crystal display device.

3. The method according to claim 1, wherein the field effect transistor is a PMOS type transistor.

4. The method according to claim 3, wherein the DC voltage value is above 10 V.

5. The method according to claim 1, wherein the field effect transistor is a NMOS type transistor.

6. The method according to claim 5, wherein the DC voltage value is below −10V.

7. The method according to claim 1, wherein a maximum value of the AC voltage pulse is above +10V and a minimum value of the AC voltage pulse is below −10V.

8. The method according to claim 1, wherein the AC voltage pulse has a frequency of 0-500 KHz.

9. The method according to claim 1, wherein an application time of the AC voltage pulse to the drain electrode is more than 10 seconds.

10. The method according to claim 1, wherein the AC voltage pulse is applied to the drain electrode a plurality times.

11. A method to reduce an OFF-current of a field effect transistor having a gate electrode, a source electrode, and a drain electrode for a liquid crystal display device having a gate line, a data line, and a common line, comprising:

applying a DC voltage to the gate electrode through the gate line to turn the field effect transistor OFF;

grounding the common line to set the source electrode to have a voltage of 0V; and applying an AC voltage pulse to the drain electrode through the date line at least once, wherein a voltage difference between the DC voltage and a minimum voltage of the AC voltage pulse is greater than a voltage difference between the DC voltage and a grounding voltage.

12. The method according to claim 11, wherein the field effect transistor is a thin film transistor of a liquid crystal panel for the liquid crystal display device.

13. The method according to claim 11, wherein the field effect transistor is a PMOS type transistor.

14. The method according to claim 13, wherein the DC voltage value is above 10V.

15. The method according to claim 11, wherein the field effect transistor is a NMOS type transistor.

16. The method according to claim 15, wherein the DC voltage value is below −10V.

17. The method according to claim 11, wherein a maximum value of the AC voltage pulse is above +10V and a minimum value of the AC voltage pulse is below −10V.

18. The method according to claim 11, wherein the AC voltage pulse has a frequency of 0-500 KHz.

19. The method according to claim 11, wherein an application time of the AC voltage pulse to the drain electrode is more than 10 seconds.

20. The method according to claim 11, wherein the AC voltage pulse is applied to the drain electrode a plurality of times.

21. A system for reducing an OFF-current of a field effect transistor having a gate electrode, a source electrode, and a drain electrode, comprising:

a gate line disposed along a first direction, being connected to the gate electrode;

a data line disposed along a second direction perpendicular to the first direction, being connected to the drain electrode;

a liquid crystal capacitor connected to the source electrode;

a common line, having a first end connected to the liquid crystal capacitor and a second end connected to ground;

a DC voltage generator for applying a DC voltage to the gate line to turn the field effect transistor OFF; and an AC voltage generator for applying an AC voltage pulse to the data line, wherein a voltage difference between the DC voltage and a minimum voltage of the AC voltage pulse is greater than a voltage difference between the DC voltage and a grounding voltage.

22. The system according to claim 21, wherein the field effect transistor is a PMOS type transistor.

23. The system according to claim 22, wherein the DC voltage value is above 10V.

24. The system according to claim 21, wherein the field effect transistor is a NMOS type transistor.

25. The system according to claim 24, wherein the DC voltage value is below −10V.

26. The system according to claim 21, wherein a maximum value of the AC voltage pulse is above +10V and a minimum value of the AC voltage pulse is below −10V.

27. The system according to claim 21, wherein the AC voltage pulse has a frequency of 0-500 KHz.

28. The system according to claim 21, wherein the AC voltage generator generates the AC voltage pulse to the data line for more than 10 seconds.

29. The system according to claim 21, wherein the AC voltage generator generates the AC voltage pulse to the data line a plurality of times.

30. The method according to claim 1, wherein a peak-to-center voltage of the AC voltage pulse is substantially the same or larger than a voltage difference between the DC voltage and a grounding voltage to generate an off-stress near at least one of drain and source junctions of the field effect transistor.

31. The method according to claim 3, wherein the DC voltage is substantially equal to or greater than a maximum voltage of the AC voltage pulse.

32. The method according to claim 5, wherein the DC voltage is substantially equal to or smaller than a minimum voltage of the AC voltage pulse.

33. The method according to claim 11, wherein a peak-to-center voltage of the AC voltage pulse is substantially the same or larger than a voltage difference between the DC voltage and a grounding voltage to generate an off-stress near at least one of drain and source junctions of the field effect transistor.

34. The system according to claim 21, wherein a peak-to-center voltage of the AC voltage pulse is substantially the same or larger than a voltage difference between the DC voltage and a grounding voltage to generate an off-stress near at least one of drain and source junctions of the field effect transistor.

35. A method for reducing an OFF-current of a field effect transistor having a gate electrode, a silicon layer, a source electrode, and a drain electrode, comprising:

applying a DC voltage to the gate electrode to turn the field effect transistor OFF;

grounding the source electrode; and applying an AC voltage pulse to the drain electrode at least once, wherein the AC voltage pulse is applied to the drain electrode to generate an off-stress while the DC voltage is applied to the gate electrode.

36. A method to reduce an OFF-current of a field effect transistor having a gate electrode, a source electrode, and a drain electrode for a liquid crystal display device having a gate line, a data line, and a common line, comprising:

applying a DC voltage to the gate electrode through the gate line to turn the field effect transistor OFF;

grounding the common line to set the source electrode to have a voltage of 0V; and applying an AC voltage pulse to the drain electrode through the date line at least once, wherein the AC voltage pulse is applied to the drain electrode to generate an off-stress while the DC voltage is applied to the gate electrode.

37. A system for reducing an OFF-current of a field effect transistor having a gate electrode, a source electrode, and a drain electrode, comprising:

a gate line disposed along a first direction, being connected to the gate electrode;

a data line disposed along a second direction perpendicular to the first direction, being connected to the drain electrode;

a liquid crystal capacitor connected to the source electrode;

a common line, having a first end connected to the liquid crystal capacitor and a second end connected to ground;

a DC voltage generator for applying a DC voltage to the gate line to turn the field effect transistor OFF; and an AC voltage generator for applying an AC voltage pulse to the data line, wherein the AC voltage pulse is applied to the drain electrode to generate an off-stress while the DC voltage is applied to the gate electrode.

* * * * *